(12) United States Patent
Cao et al.

(10) Patent No.: US 10,971,104 B2
(45) Date of Patent: Apr. 6, 2021

(54) SHIFT REGISTER AND METHOD FOR DRIVING THE SAME, GATE DRIVING CIRCUIT, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Chengying Cao, Beijing (CN); Xingyi Liu, Beijing (CN); Xuebing Jiang, Beijing (CN); Guangying Mou, Beijing (CN); Peng Wu, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/825,842

(22) Filed: Mar. 20, 2020

(65) Prior Publication Data

US 2021/0035516 A1 Feb. 4, 2021

(30) Foreign Application Priority Data

Aug. 1, 2019 (CN) .......................... 201910708676.9

(51) Int. Cl.
*G09G 3/36* (2006.01)
*G11C 19/28* (2006.01)
*G09G 3/3266* (2016.01)

(52) U.S. Cl.
CPC ......... *G09G 3/3677* (2013.01); *G09G 3/3266* (2013.01); *G11C 19/28* (2013.01);
(Continued)

(58) Field of Classification Search
CPC .............. G09G 3/3266; G09G 3/3677; G09G 2300/0408; G09G 2310/0286; G11C 19/28; G11C 19/287
See application file for complete search history.

(56) References Cited

U.S. PATENT DOCUMENTS 10,559,372 B2 * 2/2020 Du et al. ................. G11C 19/28
10,636,379 B2 * 4/2020 Feng et al. ........... G09G 3/3677
(Continued)

FOREIGN PATENT DOCUMENTS

CN 106710507 A 5/2017
CN 106847160 A 6/2017
(Continued)

OTHER PUBLICATIONS

Notification of the First Office Action issued in Chinese Application No. 201910708676.9, dated Jan. 28, 2021; with English translation.

*Primary Examiner* — Patrick O Neill
(74) *Attorney, Agent, or Firm* — McDermott Will and Emery LLP

(57) ABSTRACT

A shift register includes an output sub-circuit and a compensation sub-circuit. The output sub-circuit is coupled to a pull-up node, a clock signal terminal and a signal output terminal. The compensation sub-circuit is coupled to the pull-up node, the clock signal terminal and the signal output terminal. The output sub-circuit is configured to transmit a voltage of the clock signal terminal to the signal output terminal under control of a voltage of the pull-up node, The compensation sub-circuit is configured to transmit a voltage of the signal output terminal to the pull-up node under control of the voltage of the pull-up node and the voltage of the clock signal terminal.

19 Claims, 10 Drawing Sheets

(52) U.S. Cl.
CPC ... *G11C 19/287* (2013.01); *G09G 2300/0408* (2013.01); *G09G 2310/0286* (2013.01); *G09G 2310/08* (2013.01)

(56) References Cited

U.S. PATENT DOCUMENTS

| | | |
|---|---|---|
| 2003/0184268 A1 | 10/2003 | Perez et al. |
| 2018/0240395 A1 | 8/2018 | Liao et al. |
| 2018/0286490 A1 | 10/2018 | Sun et al. |
| 2019/0147781 A1 | 5/2019 | Park |
| 2020/0372873 A1 | 11/2020 | Huang et al. |

FOREIGN PATENT DOCUMENTS

| | | |
|---|---|---|
| CN | 106875913 A | 6/2017 |
| CN | 108269541 A | 7/2018 |
| CN | 108766383 A | 11/2018 |
| CN | 109448630 A | 3/2019 |
| CN | 109872699 A | 6/2019 |
| CN | 109935198 A | 6/2019 |
| CN | 110060645 A | 7/2019 |

\* cited by examiner

SHIFT REGISTER AND METHOD FOR DRIVING THE SAME, GATE DRIVING CIRCUIT, AND DISPLAY DEVICE

CROSS-REFERENCE TO RELATED APPLICATION

This application claims priority to Chinese Patent Application No. 201910708676.9, filed with the Chinese Patent Office on Aug. 1, 2019, which is incorporated herein by reference in its entirety.

TECHNICAL FIELD

The present disclosure relates to the field of display technologies, and in particular, to a shift register and a method for driving the same, a gate driving circuit, and a display device.

BACKGROUND

Gate driver on array (GOA) is a technique for integrating a gate driving circuit on an array substrate. Generally, a GOA unit in each stage in a GOA circuit is coupled to a gate line in the array substrate as a single shift register. Thin film transistor (TFT) switches coupled to gate line in the array substrate are turned on row by row through the GOA circuit, so as to input pixel data voltages row by row.

SUMMARY

In one aspect, a shift register is provided. The shift register includes an output sub-circuit and a compensation sub-circuit. The output sub-circuit is coupled to a pull-up node, a clock signal terminal and a signal output terminal. The compensation sub-circuit is coupled to the pull-up node, the clock signal terminal and the signal output terminal. The output sub-circuit is configured to transmit a voltage of the clock signal terminal to the signal output terminal under control of a voltage of the pull-up node. The compensation sub-circuit is configured to transmit a voltage of the signal output terminal to the pull-up node under control of the voltage of the pull-up node and the voltage of the clock signal terminal.

In some embodiments, the compensation sub-circuit includes a first compensation sub-circuit and a second compensation sub-circuit. The first compensation sub-circuit is coupled to the pull-up node and the clock signal terminal. The second compensation sub-circuit is coupled to the pull-up node, the signal output terminal and the first compensation sub-circuit. The first compensation sub-circuit is configured to transmit the voltage of the clock signal terminal to the second compensation sub-circuit under control of the voltage of the pull-up node. The second compensation sub-circuit is configured to transmit the voltage of the signal output terminal to the pull-up node under control of the received voltage of the clock signal terminal.

In some embodiments, the first compensation sub-circuit includes a first transistor. A control electrode of the first transistor is coupled to the pull-up node, and a first electrode of the first transistor is coupled to the clock signal terminal. The second compensation sub-circuit includes a second transistor. A control electrode of the second transistor is coupled to a second electrode of the first transistor, a first electrode of the second transistor is coupled to the signal output terminal, and a second electrode of the second transistor is coupled to the pull-up node.

In some embodiments, the output sub-circuit includes a scan output sub-circuit and a cascade output sub-circuit. The scan output sub-circuit is configured to transmit the voltage of the clock signal terminal as a scan signal to a scan signal output terminal under control of the voltage of the pull-up node, and the cascade output sub-circuit is configured to transmit the voltage of the clock signal terminal as a cascade signal to a cascade signal output terminal under control of the voltage of the pull-up node. The signal output terminal is one of the scan signal output terminal and the cascade signal output terminal.

In some embodiments, the signal output terminal is the cascade signal output terminal.

In some embodiments, the scan output sub-circuit includes a third transistor and a first capacitor. A control electrode of the third transistor is coupled to the pull-up node, a first electrode of the third transistor is coupled to the clock signal terminal, and a second electrode of the third transistor is coupled to the scan signal output terminal. A first electrode of the first capacitor is coupled to the pull-up node, and a second electrode of the first capacitor is coupled to the scan signal output terminal. The cascade output sub-circuit includes a fourth transistor. A control electrode of the fourth transistor is coupled to the pull-up node, a first electrode of the fourth transistor is coupled to the clock signal terminal, and a second electrode of the fourth transistor is coupled to the cascade signal output terminal.

In some embodiments, the shift register further includes a first control sub-circuit. The first control sub-circuit is coupled to a first voltage terminal, a second voltage terminal, the pull-up node and a pull-down node. The first control sub-circuit is configured to transmit a voltage received at the first voltage terminal to the pull-down node under control of the voltage of the pull-up node, and to transmit a voltage received at the second voltage terminal to the pull-down node under control of the voltage of the pull-up node and the voltage received at the second voltage terminal.

In some embodiments, the first control sub-circuit includes a fifth transistor, a sixth transistor, a seventh transistor and an eighth transistor. A control electrode of the fifth transistor is coupled to a control node, a first electrode of the fifth transistor is coupled to the second voltage terminal, and a second electrode of the fifth transistor is coupled to the pull-down node. A control electrode of the sixth transistor is coupled to the pull-up node, a first electrode of the sixth transistor is coupled to the first voltage terminal, and a second electrode of the sixth transistor is coupled to the pull-down node. A control electrode of the seventh transistor is coupled to the pull-up node, a first electrode of the seventh transistor is coupled to the first voltage terminal, and a second electrode of the seventh transistor is coupled to the control node. A control electrode and a first electrode of the eighth transistor are coupled to the second voltage terminal, and a second electrode of the eighth transistor is coupled to the control node.

In some embodiments, the shift register further includes a first pull-down sub-circuit and a second pull-down sub-circuit. The first pull-down sub-circuit is coupled to the scan signal output terminal, a third voltage terminal and a pull-down node. The first pull-down sub-circuit is configured to transmit a voltage received at the third voltage terminal to the scan signal output terminal under control of a voltage of the pull-down node. The second pull-down sub-circuit is coupled to the cascade signal output terminal, a first voltage terminal and the pull-down node. The second pull-down sub-circuit is configured to transmit a voltage received at the first voltage terminal to the cascade signal output terminal under control of the voltage of the pull-down node.

In some embodiments, the first pull-down sub-circuit includes a ninth transistor. A control electrode of the ninth transistor is coupled to the pull-down node, a first electrode of the ninth transistor is coupled to the third voltage terminal, and a second electrode of the ninth transistor is coupled to the scan signal output terminal. The second pull-down sub-circuit includes a tenth transistor. A control electrode of the tenth transistor is coupled to the pull-down node, a first electrode of the tenth transistor is coupled to the first voltage terminal, and a second electrode of the tenth transistor is coupled to the cascade signal output terminal.

In some embodiments, the shift register further includes a second control sub-circuit. The second control sub-circuit is coupled to a first voltage terminal, the pull-up node and a pull-down node. The second control sub-circuit is configured to transmit a voltage received at the first voltage terminal to the pull-up node under control of a voltage of the pull-down node.

In some embodiments, the second control sub-circuit includes an eleventh transistor. A control electrode of the eleventh transistor is coupled to the pull-down node, a first electrode of the eleventh transistor is coupled to the first voltage terminal, and a second electrode of the eleventh transistor is coupled to the pull-up node.

In some embodiments, the shift register further includes an input sub-circuit and a reset sub-circuit. The input sub-circuit is coupled to a signal input terminal and the pull-up node. The input sub-circuit is configured to transmit a voltage of the signal input terminal to the pull-up node under control of the voltage of the first signal input terminal. The reset sub-circuit is coupled to a reset signal terminal, a first voltage terminal and the pull-up node. The reset sub-circuit is configured to transmit a voltage received at the first voltage terminal to the pull-up node under control of a voltage of the reset signal terminal.

In some embodiments, the input sub-circuit includes a twelfth transistor. A control electrode and a first electrode of the twelfth transistor are coupled to the signal input terminal, and a second electrode of the twelfth transistor is coupled to the pull-up node. The reset sub-circuit includes a thirteenth transistor. A control electrode of the thirteenth transistor is coupled to the reset signal terminal, a first electrode of the thirteenth transistor is coupled to the first voltage terminal, and a second electrode of the thirteenth transistor is coupled to the pull-up node.

In some embodiments, the shift register further includes an initialization sub-circuit coupled to an initialization signal terminal, the pull-up node and a first voltage terminal. The initialization sub-circuit is configured to transmit a voltage received at the first voltage terminal to the pull-up node under control of a voltage of the initialization signal terminal.

In some embodiments, the initialization sub-circuit includes a fourteenth transistor. A control electrode of the fourteenth transistor is coupled to the initialization signal terminal, a first electrode of the fourteenth transistor is coupled to the first voltage terminal, and a second electrode of the fourteenth transistor is coupled to the pull-up node.

In another aspect, a gate driving circuit is provided. The gate driving circuit includes the shift register according to any of the above embodiments.

In yet another aspect, a display device is provided. The display device includes the gate driving circuit according to the above embodiments.

In yet another aspect, a method for driving the shift register according to any of the above embodiments is provided. The method includes: turning on the output sub-circuit under control of the voltage of the pull-up node, and transmitting, by the output sub-circuit, the voltage of the clock signal terminal to the signal output terminal; and turning on the compensation sub-circuit, and transmitting under control of the voltage of the pull-up node and the voltage of the clock signal terminal, by the compensation sub-circuit, the voltage of the signal output terminal to the pull-up node to compensate the voltage of the pull-up node.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art may obtain other drawings according to these drawings. In addition, accompanying drawings in the following description may be regarded as schematic diagrams, and are not limitations on an actual size of a product, an actual process of a method and an actual timing of signals that the embodiments of the present disclosure relate to.

DETAILED DESCRIPTION

Figure 1:
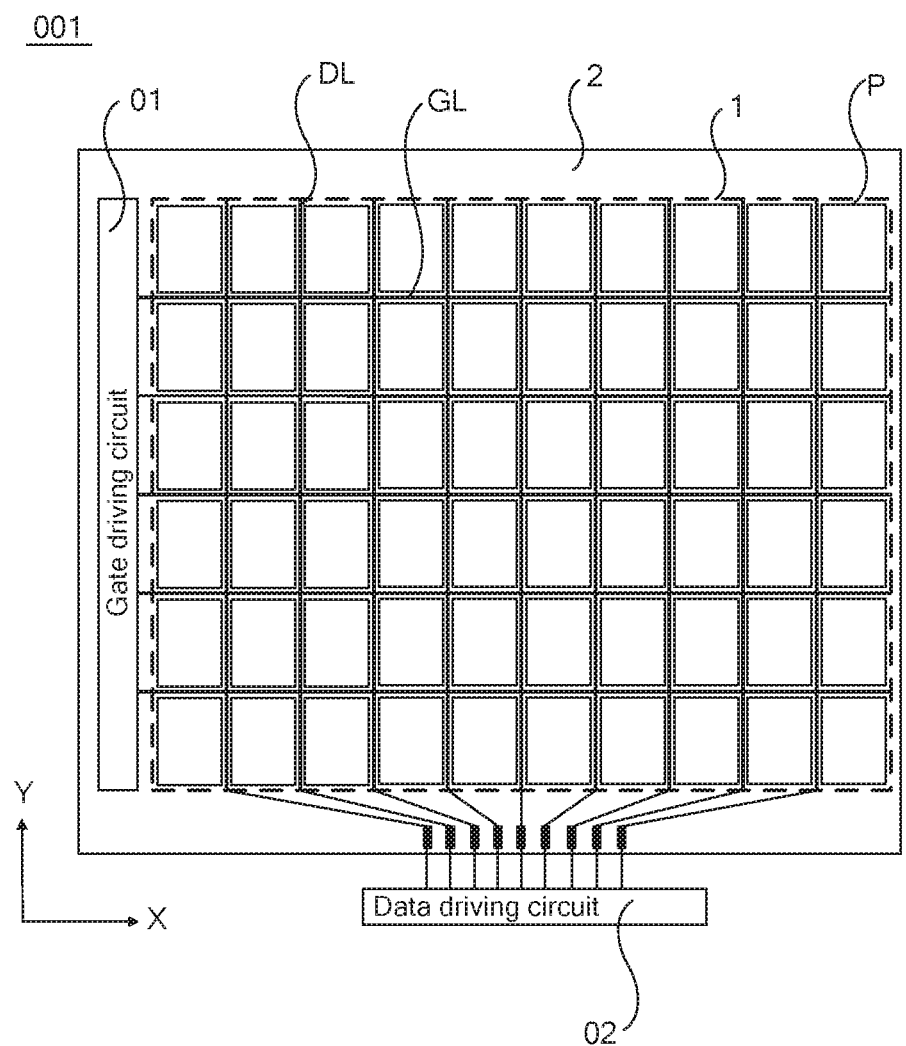
FIG. 1 is a diagram showing a structure of a display panel, according to some embodiments.

Technical solutions in some embodiments of the present disclosure will be described clearly and completely with reference to accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, term "comprise/include" and other forms thereof such as the third-person singular form "comprises/includes" and the present participle form "comprising/including" in the description and the claims are construed as open and inclusive, i.e., "inclusive, but not limited to". In the description, terms such as "one embodiment", "some embodiments", "exemplary embodiments", "example", "some examples", or "specific example" are intended to indicate that specific features, structures, materials or characteristics related to the embodiment(s) or example(s) are included in at least one embodiment or example of the present disclosure. Schematic representations of the above terms do not necessarily refer to same embodiment(s) or example(s). In addition, the specific features, structures, materials or characteristics may be included in any or more embodiments/examples in any suitable manner.

In addition, terms such as "first" and "second" are used for descriptive purposes only and are not to be construed as indicating or implying the relative importance or implicitly indicating the number of indicated technical features below. Thus, features defined as "first" and "second" may explicitly or implicitly include one or more of the features. In the description of the embodiments of the present disclosure, term "plurality" means two or more unless otherwise specified.

In the description of some embodiments, terms such as "coupled" and "connected" and their extensions may be used. For example, term "connected" may be used in the description of some embodiments to indicate that two or more components are in direct physical or electrical contact with each other. For another example, term "coupled" may be used in the description of some embodiments to indicate that two or more components are in direct physical or electrical contact. However, terms such as "coupled" or "communicatively coupled" may also mean that two or more components are not in direct contact with each other but still cooperate or interact with each other. The embodiments disclosed herein are not necessarily limited to the contents herein.

Furthermore, phrase "at least one of A, B, and C" has a same meaning as "at least one of A, B, or C", and both include the following combinations of A, B, and C: only A, only B, only C, a combination of A and B, a combination of A and C, a combination of B and C, and a combination of A, B, and C.

In the related art, a GOA circuit (i.e., a shift register) in each stage in a GOA circuit generally includes a plurality of transistors and at least one capacitor. However, as usage time goes on, threshold voltages of a part of the transistors in the shift register will drift, thereby causing that a potential at a pull-up node PU is insufficient, and further causing that an output of the GOA circuit is abnormal, for example, a potential at a pull-down node PD cannot be sufficiently reduced noise, and a scan signal cannot be output normally, which causes a multi-output phenomenon to occur.

Figure 3:
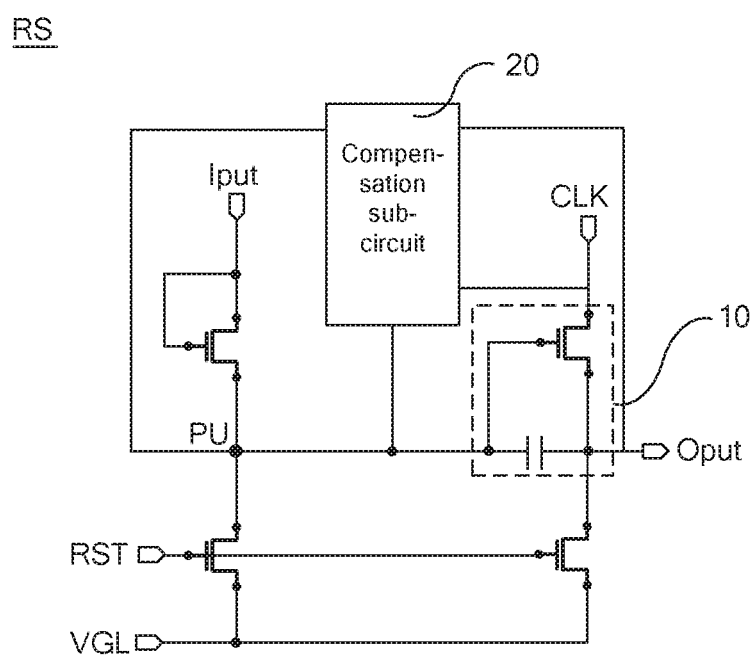
FIG. 3 is a diagram showing a structure of a shift register, according to some embodiments.

Embodiments of the present disclosure provide a shift register. As shown in FIG. 3, the shift register RS includes an input sub-circuit 10.

The output sub-circuit 10 is coupled to a pull-up node PU, a clock signal terminal CLK and a signal output terminal Output (abbreviated as Oput hereinafter and in the drawings). The output sub-circuit 10 is configured to transmit a voltage of the clock signal terminal CLK to the signal output terminal Oput under control of a voltage of the pull-up node PU.

That is to say, a scan signal output from the signal output terminal Oput of the shift register RS is a clock signal output from the clock signal terminal CLK.

In a working process of the shift register RS, a potential at the pull-up node PU and a potential at a pull-down node PD may be a group of inverted potentials. For example, in a case where the pull-up node PU is at a high potential, the pull-down node PD is at a low potential; and in a case where the pull-up node PU is at a low potential, the pull-down node PD is at a high potential.

Figure 4:
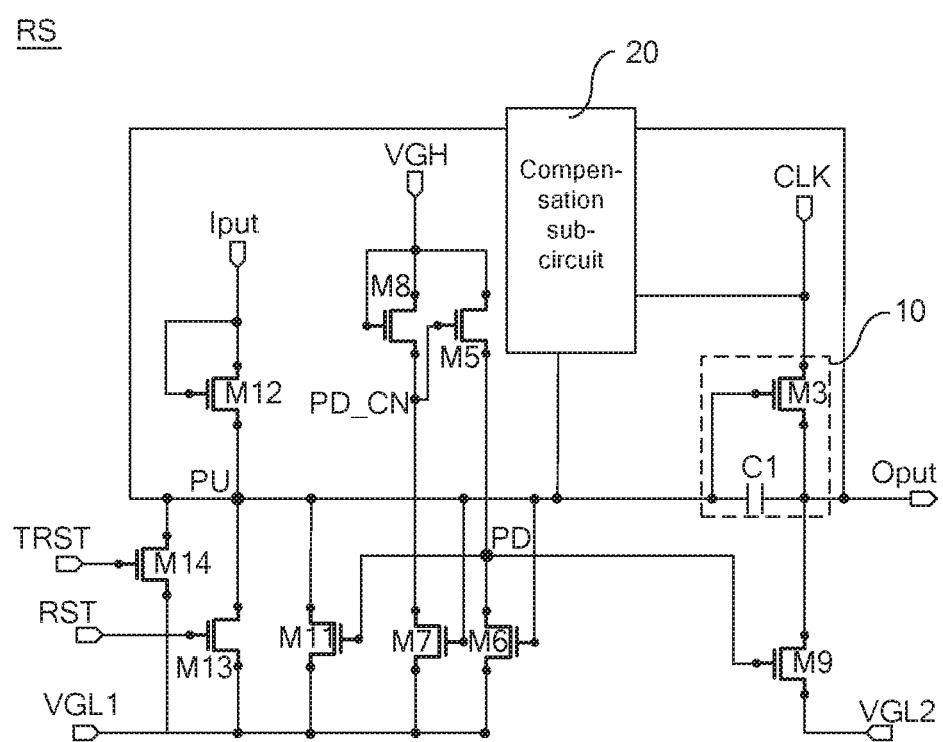
FIG. 4 is a diagram showing a structure of another shift register, according to some embodiments.

As shown in FIG. 4, the shift register RS in some embodiments of the present disclosure further includes a compensation sub-circuit 20. The compensation sub-circuit 20 is coupled to the pull-up node PU, the clock signal terminal CLK and the signal output terminal Oput. The compensation sub-circuit 20 is configured to transmit a voltage of the signal output terminal Oput to the pull-up node PU under control of the voltage of the pull-up node PU and the voltage of the clock signal terminal CLK.

That is to say, in the embodiments of the present disclosure, the compensation sub-circuit 20 is provided in the shift register RS, and under control of the voltage of the pull-up node PU and the voltage of the clock signal terminal CLK, the voltage of the signal output terminal Oput may be transmitted to the pull-up node PU through the compensation sub-circuit 20, so as to compensate the voltage of the pull-up node PU.

For example, in a scan signal output period of the shift register RS, the scan signal may be transmitted to the pull-up node PU through the compensation sub-circuit 20, thereby compensating the voltage of the pull-up node PU (i.e, maintaining the potential at the pull-up node PU), so as to avoid a problem of abnormal output caused by a fact that the potential at the pull-up node PU is insufficient (i.e., the potential at the pull-up node PU is not maintained) in a process of driving the shift register RS.

Figure 5:
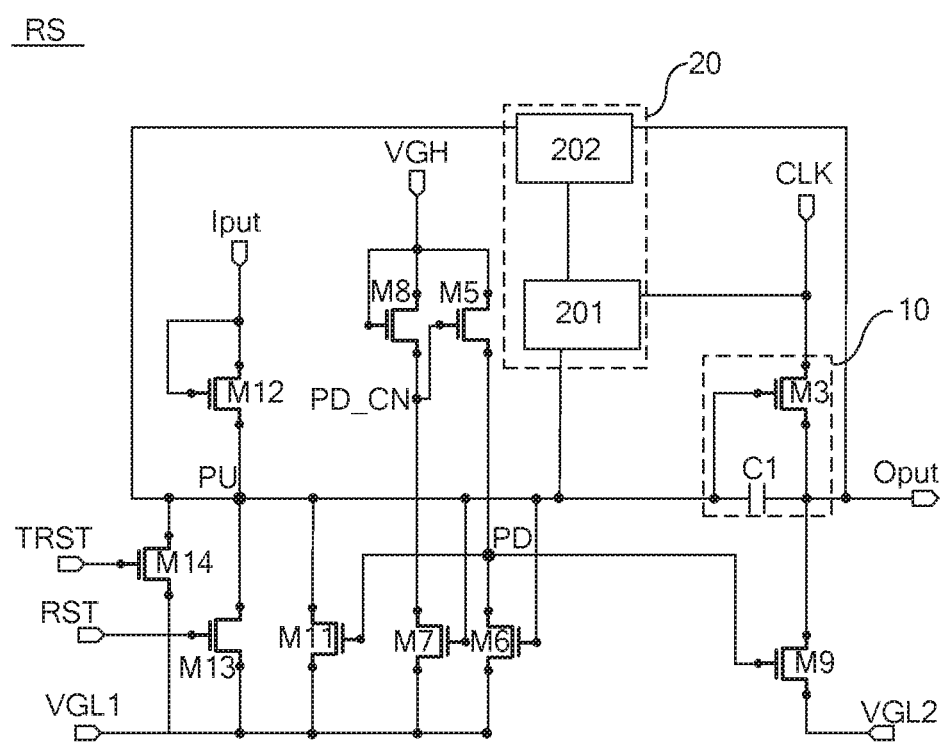
FIG. 5 is a diagram showing a structure of yet another shift register, according to some embodiments.

In some embodiments, as shown in FIG. 5, the compensation sub-circuit 20 includes a first compensation sub-circuit 201 and a second compensation sub-circuit 202. The first compensation sub-circuit 201 is coupled to the pull-up node PU and the clock signal terminal CLK. The second compensation sub-circuit 202 is coupled to the pull-up node PU, the signal output terminal Oput and the first compensation sub-circuit 201.

On this basis, the first compensation sub-circuit 201 is configured to transmit the voltage of the clock signal terminal CLK to the second compensation sub-circuit 202 under control of the voltage of the pull-up node PU, and the second compensation sub-circuit 202 is configured to transmit the voltage of the signal output terminal Oput to the pull-up node PU under control of the received voltage of the clock signal terminal CLK.

Figure 6:
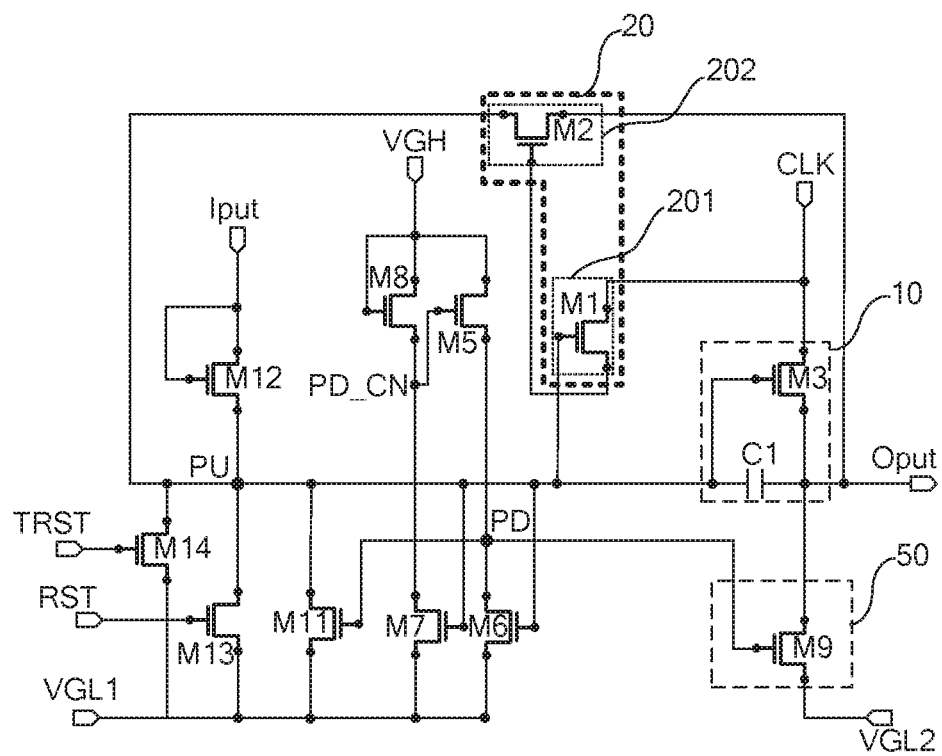
FIG. 6 is a diagram showing a structure of yet another shift register, according to some embodiments.

For example, as shown in FIG. 6, the first compensation sub-circuit 201 includes a first transistor M1. A control electrode of the first transistor M1 is coupled to the pull-up node PU, and a first electrode of the first transistor M1 is coupled to the clock signal terminal CLK.

The second compensation sub-circuit 202 includes a second transistor M2. A control electrode of the second transistor M2 is coupled to a second electrode of the first transistor M1, a first electrode of the second transistor M2 is coupled to the signal output terminal Oput, and a second electrode of the second transistor M2 is coupled to the pull-up node PU.

In this way, in the process of driving the shift register RS, the first transistor M1 is turned on, and transmits the voltage of the clock signal terminal CLK to the control electrode of the second transistor M2 under control of the voltage of the pull-up node PU. Then the second transistor M2 is tuned on, and transmits (i.e., compensates) the voltage of the signal output terminal Oput to the pull-up node PU, thereby compensating the voltage of the pull-up node PU, so as to maintain the potential at the pull-up node PU and avoid a phenomenon of insufficient charging of the pull-up node PU.

In some embodiments, as shown in FIG. 6, the output sub-circuit 10 in the shift register RS is coupled to a single signal output terminal Oput. In this case, the signal output terminal Oput is coupled to the compensation sub-circuit 20.

In a case where the output sub-circuit 10 in the shift register RS is coupled to a single signal output terminal Oput, the signal output terminal Oput is coupled to a gate line GL in a display panel 001, so as to transmit a scan signal to the gate line GL. Moreover, the signal output terminal Oput is further coupled to other shift registers in a gate driving circuit 01, so as to transmit cascade signals (such as reset signals and turn-on signals) to the other shift registers. For example, the signal output terminal Oput may be coupled to a previous-stage shift register and is used to transmit a reset signal to the previous-stage shift register. And, the signal output terminal Oput may also be coupled to a next-stage shift register and is used to transmit a turn-on signal to the next-stage shift register.

In some other embodiments, as shown in FIG, 7, the output sub-circuit 10 in the shift register RS is coupled to two signal output terminals. The two signal output terminals are a scan signal output terminal Oput_G and a cascade signal output terminal Oput_C. In this case, the output sub-circuit 10 includes a scan output sub-circuit 101 and a cascade output sub-circuit 102. The scan output sub-circuit 101 is coupled to the pull-up node PU, the clock signal terminal CLK and the scan signal output terminal Oput_G. The cascade output sub-circuit 102 is coupled to the pull-up node PU, the clock signal terminal CLK and the cascade signal output terminal Oput_C.

On this basis, the scan output sub-circuit 101 is configured to transmit the voltage of the clock signal terminal CLK as a scan signal to the scan signal output terminal Oput_G under control of the voltage of the pull-up node PU, and the cascade output sub-circuit 102 is configured to transmit the voltage of the clock signal terminal CLK as a cascade signal to the cascade signal output terminal Oput_C under control of the voltage of the pull-up node PU.

In a case where the shift register RS includes the scan signal output terminal Oput_G and the cascade signal output terminal Oput_C, the scan signal output terminal Oput_G is coupled to a gate line GL in the display panel 001, so as to transmit the scan signal to the gate line GL, and the cascade signal output terminal Oput_C is coupled to other shift registers in a gate driving circuit 01, so as to transmit the cascade signals (such as the reset signals and the turn-on signals) to the other shift registers.

It will be understood that, in the case shown in FIG. 6 where the output sub-circuit 10 in the shift register RS is coupled to a single signal output terminal Oput, that is, the scan signal output from the shift register RS is used as control signals (such as the turn-on signals or the reset signals) of shift registers in other stages, abnormal outputs of the shift registers in other stages will be easily caused by an abnormal output of one shift register in a certain stage. By contrast, in the case shown in FIG. 7 where the output sub-circuit 10 in the shift register RS is coupled to two signal output terminals (i.e., the scan signal output terminal Oput_G and the cascade signal output terminal Oput_C), the scan signal and the cascade signals are output separately. Therefore, in a case where there is an abnormal output in the scan signal of one shift register in a certain stage, the cascade signals of the register in the certain stage may be still normally output. In this way, the cascade signals may be used as control signals of shift registers in other stages, so that the shift registers in other stages may still output scan signals normally, thereby improving a stability of an output of the gate driving circuit 01.

Figure 7:
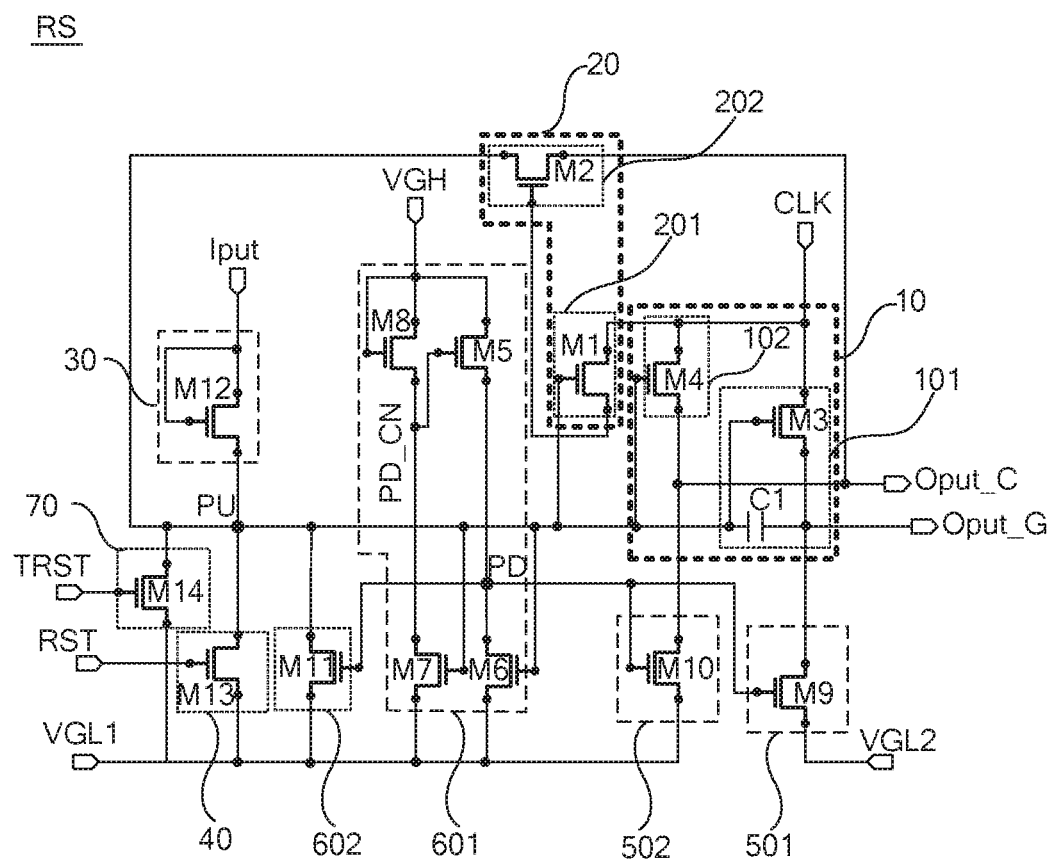
FIG. 7 is a diagram showing a structure of yet another shift register, according to some embodiments.

In addition, in the case shown in FIG. 7 where the output sub-circuit 10 is coupled to two signal output terminals (i.e., Oput_G and Oput_C), the above signal output terminal Oput coupled to the compensation sub-circuit 20 may be any one of the scan signal output terminal Oput_G and the cascade signal output terminal Oput_C.

Since a load applied to the scan signal output terminal Oput_G is very large, in order to improve a stability of the gate driving circuit 01, in some embodiments, as shown in FIG. 7, the above signal output terminal Oput coupled to the compensation sub-circuit 20 is the cascade signal output terminal Oput_C, that is, the compensation sub-circuit 20 is controlled by the cascade signal output from the cascade signal output terminal Oput_C, so as to compensate the voltage of the pull-up node PU.

In addition, a person skilled in the art will understand that, the shift register RS further includes other related control circuit(s) coupled to the pull-up node PU and the pull-down node PD other than the output sub-circuit 10 and the compensation sub-circuit 20, which is not specifically limited in the present disclosure. Appropriate related circuit(s) may be disposed as needed in practice, as long as the shift register may normally output the scan signal.

For example, as shown in FIG. 7, the scan output sub-circuit 101 includes a third transistor M3 and a first capacitor Cl. A gate of the third transistor M3 is coupled to the pull-up node PU, a first electrode of the third transistor M3 is coupled to the clock signal terminal CLK, and a second electrode of the third transistor M3 is coupled to the scan signal output terminal Oput_G. A first electrode of the first capacitor Cl is coupled to the pull-up node PU, and a second electrode of the first capacitor Cl is coupled to the scan signal output terminal Oput_G.

For example, as shown in FIG. 7, the cascade output sub-circuit 102 includes a fourth transistor M4. A gate of the fourth transistor M4 is coupled to the pull-up node PU, a first electrode of the fourth transistor M4 is coupled to the clock signal terminal CLK, and a second electrode of the fourth transistor M4 is coupled to the cascade signal output terminal Oput_C.

In some embodiments, as shown in FIG. 7, the shift register RS further includes a first control sub-circuit 601.

As shown in FIG. 7, the first control sub-circuit 601 is coupled to a first voltage terminal VGL1, a second voltage terminal VGH, the pull-up node PU and the pull-down node PD. The first control sub-circuit 601 is configured to transmit a voltage received at the first voltage terminal VGL1 to the pull-down node PD under control of the voltage of the pull-up node PU, and to transmit a voltage received at the second voltage terminal VGH to the pull-down node PD under control of the voltage of the pull-up node PU and the voltage received at the second voltage terminal VGH.

For example, as shown in FIG. 7, the first control sub-circuit 601 includes a fifth transistor M5, a sixth transistor M6, a seventh transistor M7 and an eighth transistor M8.

A control electrode of the fifth transistor M5 is coupled to a control node PD_CN, a first electrode of the fifth transistor M5 is coupled to the second voltage terminal UGH, and a second electrode of the fifth transistor M5 is coupled to the pull-down node PD.

A control electrode of the sixth transistor M6 is coupled to the pull-up node PU, a first electrode of the sixth transistor M6 is coupled to the first voltage terminal VGL1, and a second electrode of the sixth transistor M6 is coupled to the pull-down node PD.

A control electrode of the seventh transistor M7 is coupled to the pull-up node PU, a first electrode of the seventh transistor M7 is coupled to the first voltage terminal VGL1, and a second electrode of the seventh transistor M7 is coupled to the control node PD_CN.

A control electrode and a first electrode of the eighth transistor M8 are coupled to the second voltage terminal VGH, and a second electrode of the eighth transistor M8 is coupled to the control node PD_CN.

In some embodiments, in the case where the output sub-circuit 10 includes the scan output sub-circuit 101 and the cascade output sub-circuit 102 (that is, in the case where the output sub-circuit 10 is coupled to two signal output terminals), as shown in FIG. 7, the shift register RS further includes a first pull-down sub-circuit 501 and a second pull-down sub-circuit 502. Of course, in the case shown in FIG. 6 where the output sub-circuit 10 is coupled to a single signal output terminal, the shift register RS may include a single pull-down sub-circuit. The following embodiments are all described by taking an example shown in FIG. 7 where the shift register RS includes the first pull-down sub-circuit 501 and the second pull-down sub-circuit 502.

As shown in FIG. 7, the first pull-down sub-circuit 501 is coupled to the scan signal output terminal Oput_G, a third voltage terminal VGL2 and the pull-down node PD. The first pull-down sub-circuit 501 is configured to transmit a voltage received at the third voltage terminal VGL2 to the scan signal output terminal Oput_G under control of a voltage of the pull-down node PD.

For example, as shown in FIG. 7, the first pull-down sub-circuit 501 includes a ninth transistor M9. A control electrode of the ninth transistor M9 is coupled to the pull-down node PD, a first electrode of the ninth transistor M9 is coupled to the third voltage terminal VGL2, and a second electrode of the ninth transistor M9 is coupled to the scan signal output terminal Oput_G.

As shown in FIG. 7, the second pull-down sub-circuit 502 is coupled to the cascade signal output terminal Oput_C, the first voltage terminal VGL1 and the pull-down node PD. The second pull-down sub-circuit 502 is configured to transmit the voltage received at the first voltage terminal VGL1 to the cascade signal output terminal Oput_C under control of the voltage of the pull-down node PD.

For example, as shown in FIG, 7, the second pull-down sub-circuit 502 includes a tenth transistor M10. A control electrode of the tenth transistor M10 is coupled to the pull-down node PD, a first electrode of the tenth transistor M10 is coupled to the first voltage terminal VGL1, and a second electrode of the tenth transistor M10 is coupled to the cascade signal output terminal Oput_C.

It will be noted here that, in some embodiments, the first voltage terminal VGL1 and the third voltage terminal VGL2 may be electrically connected to each other, and in some other embodiments, the first voltage terminal VGL1 and the third voltage terminal VGL2 may be separately provided voltage terminals.

In a display device, in a case where the first voltage terminal VGL1 and the third voltage terminal VGL2 are provided as two separate voltage terminals, the voltage of the third voltage terminal VGL2 may be controlled and adjusted separately, for example, the voltage of the third voltage terminal VGL2 may be adjusted to a high-level voltage before the display device is turned off. Therefore, the voltage of the third voltage terminal VGL2 may be transmitted to the scan signal output terminal Oput_G through the ninth transistor M9 before the display device is turned off, and all pixel circuits S in the display panel 001 are turned on for discharging, so as to prevent residual charges from adversely affecting the display panel.

In some embodiments, as shown in FIG. 7, the shift register RS further includes a second control sub-circuit 602.

The second control sub-circuit 602 is coupled to the first voltage terminal VGL1, the pull-up node PU and the pull-down node PD. The second control sub-circuit 602 is configured to transmit the voltage received at the first voltage terminal VGL1 to the pull-up node PU under control of the voltage of the pull-down node PD.

For example, as shown in FIG. 7, the second control sub-circuit 602 includes an eleventh transistor M11. A control electrode of the eleventh transistor M11 is coupled to the pull-down node PD, a first electrode of the eleventh transistor M11 is coupled to the first voltage terminal VGL1, and a second electrode of the eleventh transistor M11 is coupled to the pull-up node PU.

In some embodiments, as shown in FIG. 7, the shift register RS further includes an input sub-circuit 30.

As shown in FIG. 7, the input sub-circuit 30 is coupled to a signal input terminal Input (abbreviated as Iput hereinafter and in the drawings) and the pull-up node PU. The input sub-circuit 30 is configured to transmit a voltage of the signal input terminal Iput to the pull-up node PU under control of the voltage of the signal input terminal Iput.

For example, as shown in FIG. 7, the input sub-circuit 30 includes a twelfth transistor M12. A control electrode and a first electrode of the twelfth transistor M12 are both coupled to the signal input terminal Iput, and a second electrode of the twelfth transistor M12 is coupled to the pull-up node PU.

In some embodiments, as shown in FIG. 7, the shift register RS further includes a reset sub-circuit 40.

As shown in FIG. 7, the reset sub-circuit 40 is coupled to a reset signal terminal Reset (abbreviated as RST hereinafter and in the drawings), the first voltage terminal VGL1 and the pull-up node PU. The reset sub-circuit 40 is configured to transmit the voltage received at the first voltage terminal VGL1 to the pull-up node PU under control of a voltage of the reset signal terminal RST.

For example, as shown in FIG. 7, the reset sub-circuit 40 includes a thirteenth transistor M13. A control electrode of the thirteenth transistor M13 is coupled to the reset signal terminal RST, a first electrode of the thirteenth transistor M13 is coupled to the first voltage terminal VGL1, and a second electrode of the thirteenth transistor M13 is coupled to the pull-up node PU.

In some embodiments, as shown in FIG. 7, the shift register RS further includes an initialization sub-circuit 70.

As shown in FIG. 7, the initialization sub-circuit 70 is coupled to an initialization signal terminal (Total reset, abbreviated as TRST hereinafter and in the drawings), the pull-up node PU and the first voltage terminal VGL1. The initialization sub-circuit 70 is configured to transmit the voltage received at the first voltage terminal VGL1 to the pull-up node PU under control of a voltage of the initialization signal terminal TRST.

For example, as shown in FIG. 7, the initialization sub-circuit 70 includes a fourteenth transistor M14. A controlelectrode of the fourteenth transistor M14 is coupled to the initialization signal terminal TRST, a first electrode of the fourteenth transistor M14 is coupled to the first voltage terminal VGL1, and a second electrode of the fourteenth transistor M14 is coupled to the pull-up node PU.

It will be noted that, the transistors used in the shift register RS provided by the embodiments of the present disclosure may be thin film transistors (TFTs), field-effect transistors or other switching devices with same characteristics, which is not limited in the embodiments of the present disclosure.

In some embodiments, a control electrode of each transistor used in the shift register RS is a gate of the transistor, a first electrode of the transistor is one of a source and a drain of the transistor, and a second electrode of the transistor is the other of the source and the drain of the transistor. Since the source and the drain of a same transistor may be symmetrical in structure, there may be no difference in structure between the source and the drain of the same transistor. That is, there may be no difference in structure between the first electrode and the second electrode of the same transistor in the embodiments of the present disclosure. For example, in a case where one transistor is a P-type transistor, the first electrode of the transistor is the source, and the second electrode of the transistor is the drain. For another example, in a case where one transistor is an N-type transistor, the first electrode of the transistor is the drain, and the second electrode of the transistor is the source.

In the shift register RS provided by the embodiments of the present disclosure, the pull-up node PU, the pull-down node PD and the control node PD_CN do not represent actual components, but rather represent junctions of related electrical connections in a circuit diagram. That is, these nodes are nodes equivalent to the junctions of the related electrical connections in the circuit diagram.

In the shift register RS provided by the embodiments of the present disclosure, specific implementation manners of the output sub-circuit 10, the compensation sub-circuit 20 (the first compensation sub-circuit 201 and the second compensation sub-circuit 202), the scan output sub-circuit 101, the cascade output sub-circuit 102, the first control sub-circuit 601, the second control sub-circuit 602, the first pull-down sub-circuit 501, the second pull-down sub-circuit 502, the input sub-circuit 30, the reset sub-circuit 40 and the initialization sub-circuit 70 are not limited to the above manners, and may be any implementation manner used, such as a conventional coupling manner well known to a person skilled in the art, as long as corresponding functions may be achieved. The above examples do not limit the protection scope of the present disclosure. In practical applications, a person skilled in the art may choose to use or not to use one or more of the above circuits according to situations. Various combinations and modifications based on the above circuits do not depart from a principle of the present disclosure, and details are not described herein again.

The embodiments of the present disclosure further provide a display panel. As shown in FIG. 1, the display panel 001 includes a display area 1 (also known as active display area, abbreviated as AA) and a peripheral area 2 disposed at at least one side of the display area 1.

In addition, as shown in FIG. 1, the display panel 001 includes a plurality of gate lines GL and a plurality of data lines DL, and the gate lines GL and the data lines DL jointly define a plurality of sub-pixels P in the display area 1. The plurality of sub-pixels P include sub-pixels of a first color, sub-pixels of a second color and sub-pixels of a third color. The first color, the second color and the third color are three primary colors (e.g., red, green and blue).

For convenience of description, the embodiments of the present disclosure are described by taking an example in which the plurality of sub-pixels P are arranged in a matrix. In this case, sub-pixels P arranged in a line in a row direction X are referred to as sub-pixels in a same row. Sub-pixels P arranged in a line in a column direction Y are referred to as sub-pixels in a same column. The gate lines GL extend in the row direction X, and the data lines DL extend in the column direction Y.

Figure 2:
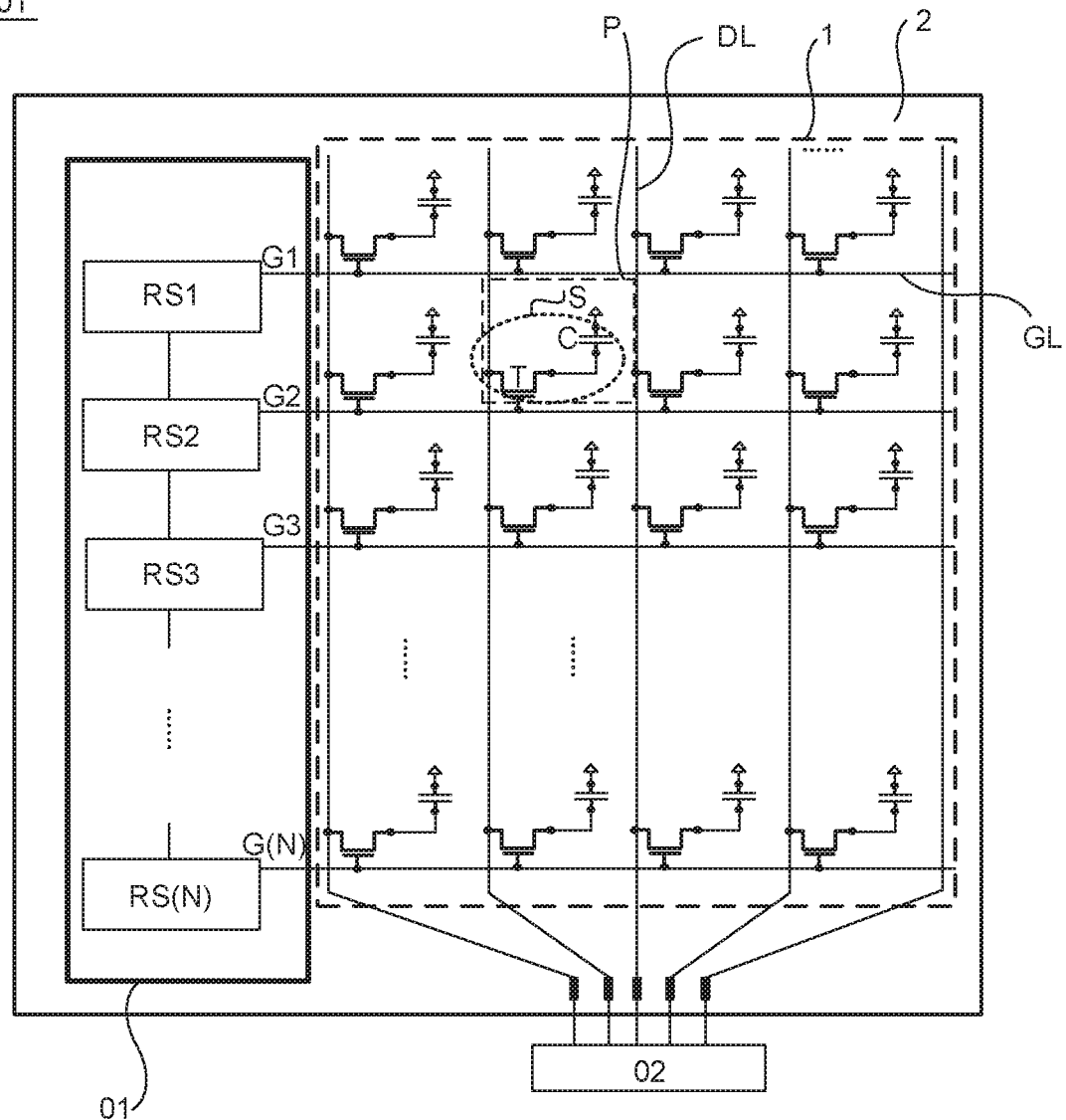
FIG. 2 is a circuit diagram of a display panel, according to some embodiments.

FIG. 2 is a circuit diagram of the display panel 001 provided by the embodiments of the present disclosure. As shown in FIG. 2, each sub-pixel P is provided with a pixel circuit S therein, and the pixel circuit S includes a transistor T and a liquid crystal capacitor C. Two electrode plates of the liquid crystal capacitor C are a pixel electrode and a common electrode, respectively. Gates of transistors T of pixel circuits S in a same row are coupled to a same gate line GL. Electrodes (e.g., sources) of transistors T of pixel circuits S in a same column are coupled to a same data line DL, and other electrodes (e.g., drains) of the transistors T of the pixel circuits S in the same column are coupled to pixel electrodes in corresponding sub-pixels P where the pixel circuits S in the same column are located.

In addition, as shown in FIG. 1 or 2, the display panel 001 further includes a gate driving circuit 01 and a data driving circuit 02. The gate driving circuit 01 is disposed in the peripheral area 2. The data driving circuit 02 is bonded to the peripheral area 2 in a form of an integrated circuit (IC), that is, the data driving circuit 02 may be a date driving IC.

In some embodiments, the gate driving circuit 01 may be disposed in a portion of the peripheral area 2 in an extending direction of the gate lines GL, and the data driving circuit 02 may be bonded to a portion of the peripheral area 2 in an extending direction of the data lines DL. The pixel circuits S are turned on row by row through the gate driving circuit 01, and in a case where pixel circuits S in a row are turned on, pixel data voltages are written into the pixel circuits S in the row through the data driving circuit 02, so as to display an image.

In some embodiments, the gate driving circuit 01 is bonded to the peripheral area 2 in a form of an integrated circuit (IC), that is, the gate driving circuit 01 may be a gate driving IC.

In some other embodiments, the gate driving circuit 01 may be a gate driver on array (GOA) circuit, that is, the gate driving circuit 01 is directly integrated into an array substrate of the display panel 001.

Compared with providing the gate driving circuit 01 as the gate driving IC, providing the gate driving circuit 01 as the GOA circuit may reduce a manufacturing cost of the display panel on one hand, and may also narrow a width of a bezel of a display device including the display panel on another hand. The embodiments of the present disclosure are described by taking an example in which the gate driving circuit 01 is the GOA circuit.

It will be noted that, FIGS. 1 and 2 merely show an example in which a single-sided driving is used in the display panel 001. That is, the gate driving circuit 01 is disposed at a single side of the peripheral area 2 of the display panel 001, and the gate lines GL are sequentially driven row by row from the side.

In some other embodiments, a double-sided simultaneous driving may be used in the display panel 001. That is, gate driving circuits 01 are respectively disposed at both sides in the extending direction of the gate lines GL in the peripheral area 2 of the display panel 001, and the gate lines GL are sequentially driven row by row from the both sides simultaneously through the two gate driving circuits 01.

In yet some other embodiments, a double-sided alternate driving may be used in the display panel 001. That is, the gate driving circuits 01 are respectively disposed on both sides in the extending direction of the gate lines GL in the peripheral area 2 of the display panel 001, and the gate lines GL are sequentially driven row by row from both sides alternately through the two gate driving circuits 01).

In the following embodiments of the present disclosure, the gate driving circuit 01 provided in the embodiments of the present disclosure is described by taking the single-sided driving as an example. The gate driving circuit 01 may also be referred to as the GOA circuit, and the shift register may also be referred to as a GOA unit.

As shown in FIG. 2, in some embodiments of the present disclosure, the gate driving circuit 01 includes N stages of cascaded shift registers (RS1, RS2, . . . , and RS(N)). The display panel 001 includes N gate lines (G1, G2, . . . , and G(N)) coupled to the N stages of cascaded shift registers (RS1, RS2, , . . . , and RS(N)) in one-to-one correspondence, and N is a positive integer.

Specific cascade condition of the gate driving circuit 01 in the embodiments of the present disclosure will be further described below in combination with the shift registers RS shown in FIGS. 4, 5, 6 and 7.

Figure 8:
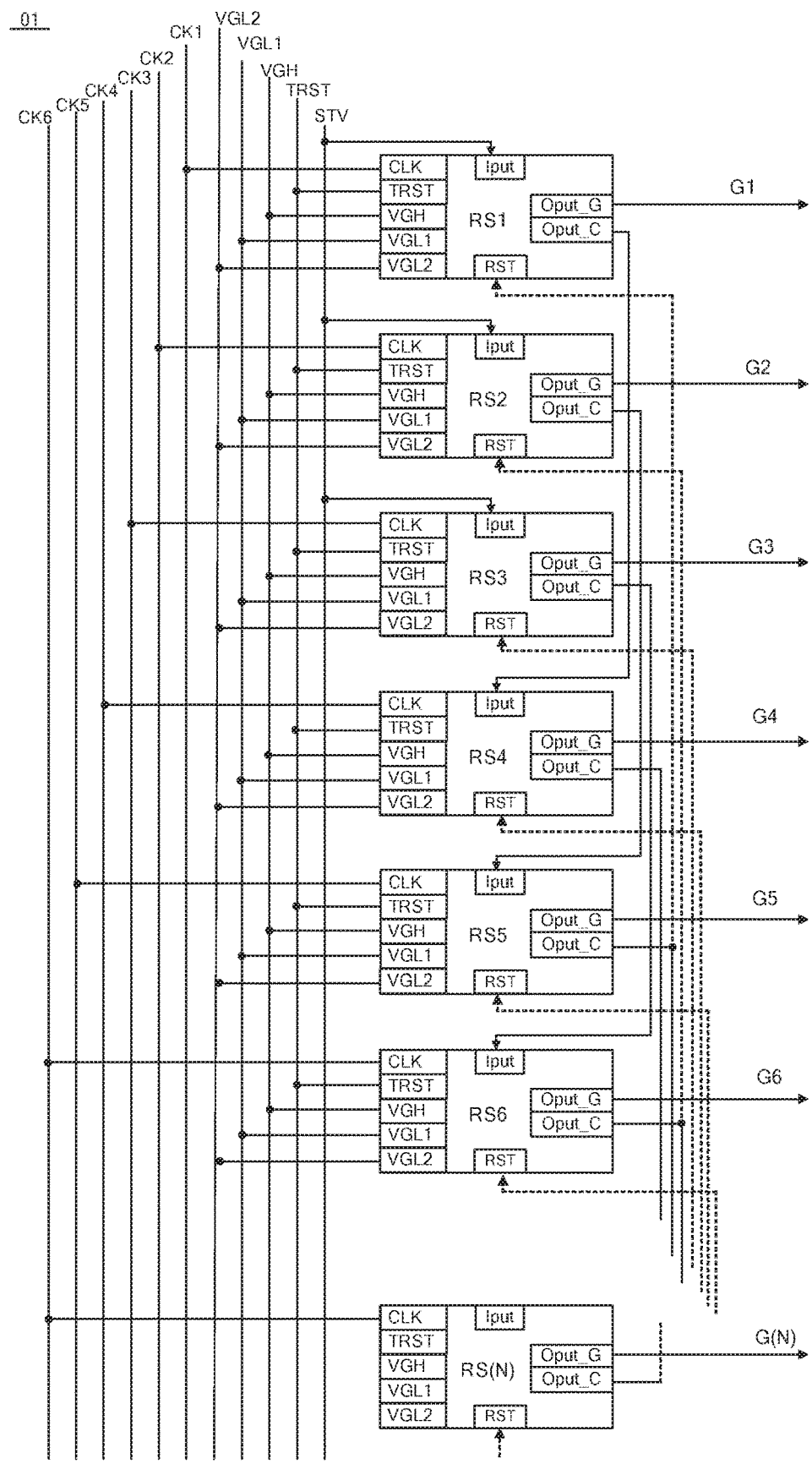
FIG. 8 is a diagram showing a structure of a gate driving circuit, according to some embodiments.

Referring to FIG. 8, in the gate driving circuit 01, signal input terminals Iput of first M stages of shift registers are coupled to a start signal terminal STV, and M is an integer greater than or equal to 1 (M-1). For example, M is equal to 3 in FIG. 8. Except for the first M stages of shift registers, a signal input terminal put of a shift register in any other stage is coupled to a signal output terminal Oput of a previous-stage shift register. A reset signal terminal RST of a last-stage shift register or reset signal terminals RST of last multiple stages of shift registers are separately disposed or are coupled to the start signal terminal STV. Except for the last-stage shift register or the last multiple stages of shift registers, a reset signal terminal RST of a shift register in any stage is coupled to a signal output terminal Oput of a next-stage shift register.

In addition, in the gate driving circuit 01, a multi-clock signal mode may be used as for clock signal terminals CLK in stages of shift registers. For example, the multi-clock signal mode may be a 4-clock signal mode (i.e., 4CLK), a 6-clock signal mode (i.e., 6CLK), an 8-clock signal mode (i,e., 8CLK) or a 10-clock signal mode (i,e., 10CLK), which is not limited in the present disclosure.

In addition, a current mode of the shift register RS in the embodiments of the present disclosure may be a direct current (DC) mode (referring to FIG. 7) or an alternating current (AC) mode, which is not specifically limited in the present disclosure.

The specific cascade condition and connection condition of related signal terminals of the gate driving circuit 01 will be described below by taking an example in which the shift register RS shown in FIG. 7 is used.

For example, in some embodiments, as shown in FIG. 8, in the gate driving circuit 01:

Signal input terminals Iput of a first-stage shift register RS1, a second-stage shift register RS2 and a third-stage shift register RS3 are all coupled to a start signal terminal STV.

In some embodiments, as shown in FIG. 8, the signal input terminals Iput of the first-stage shift register RS1, the second-stage shift register RS2 and the third-stage shift register RS3 may be coupled to a same start signal terminal STV.

In some embodiments, the signal input terminals Iput of the first-stage shift register RS1, the second-stage shift register RS2 and the third-stage shift register RS3 may be respectively coupled to separately disposed start signal terminals STV.

On this basis, a signal input terminal Iput of an i-th-stage shift register RSi is coupled to a cascade signal output terminal Oput_C of a (i-3)-th-stage shift register RS(i-3). i is greater than or equal to 4, and is less than or equal to N (4≤i≤N), and i sequentially takes an integer value in set [4, N] in turn.

A reset signal terminal RST of a j-th-stage shift register RSj is coupled to a cascade signal output terminal Oput_C of a (j+4)-th-stage shift register RS(j+4). j is greater than or equal to 1, and is less than or equal to N−4 (1≤j≤(N−4)), and j takes an integer value in set [1, N−4] in turn.

Reset signal terminals RST of last three stages of shift registers are separately disposed.

In addition, as shown in FIG. 8, the 6-clock signal mode (i.e., 6CLK) may be used in the gate driving circuit 01. That is, six clock signal lines (CK1, CK2, CK3, CK4, CK5, and CK6) are disposed in the peripheral area 2 of the array substrate. The six clock signal lines are periodically and sequentially coupled to the clock signal terminals CLK of the cascaded shift registers (RS1, RS2 , . . . , and RS(N)).

In addition, the array substrate is further provided with an initialization signal line coupled to the initialization signal terminals TRST of the stages of shift registers (RS1, RS2 . . ., and RS(N)), a first voltage signal line coupled to the first voltage terminals VGL1 of the stages of shift registers (RS1, RS2 and RS(N)), a second voltage signal line coupled to the second voltage terminals VGH of the stages of shift registers (RS1, RS2 . . . , and RS(N)), and a third voltage signal line coupled to the third voltage terminals VGL2 of the stages of shift registers (RS1, RS2 . . . , and RS(N)).

It will be noted that, for convenience of description, as shown in FIG. 8, the initialization signal terminals TRST and the initialization signal line are all represented by TRST, the first voltage terminals VGL1 and the first voltage signal line are all represented by VGL1, the second voltage terminals VGH and the second voltage signal line are all represented by VGH, and the third voltage terminals VGL2 and the third voltage signal line are all represented by VGL2. However, the initialization signal terminals TRST and the initialization signal line TRST, the first voltage terminals VGL1 and the first voltage signal line VGL1, the second voltage terminals VGH and the second voltage signal line VGH, and the third voltage terminals VGL2 and the third voltage signal line VGL2 are all different components.

On this basis, a method for driving the shift register RS provided in the embodiments of the present disclosure will be described below by taking an example in which the shift register RS shown in FIG. 7 is used in the gate driving circuit 01 in FIG. 8, with reference to the timing diagram of FIG. 9, and by taking the first-stage shift register RS1 as an example.

It will be noted that, turn-on and turn-off processes of the transistors in the embodiments of the preset disclosure are described by taking an example in which all the transistors are the N-type transistors. In a case where all the transistors are the P-type transistors, control signals need to be inverted.

Figure 9:
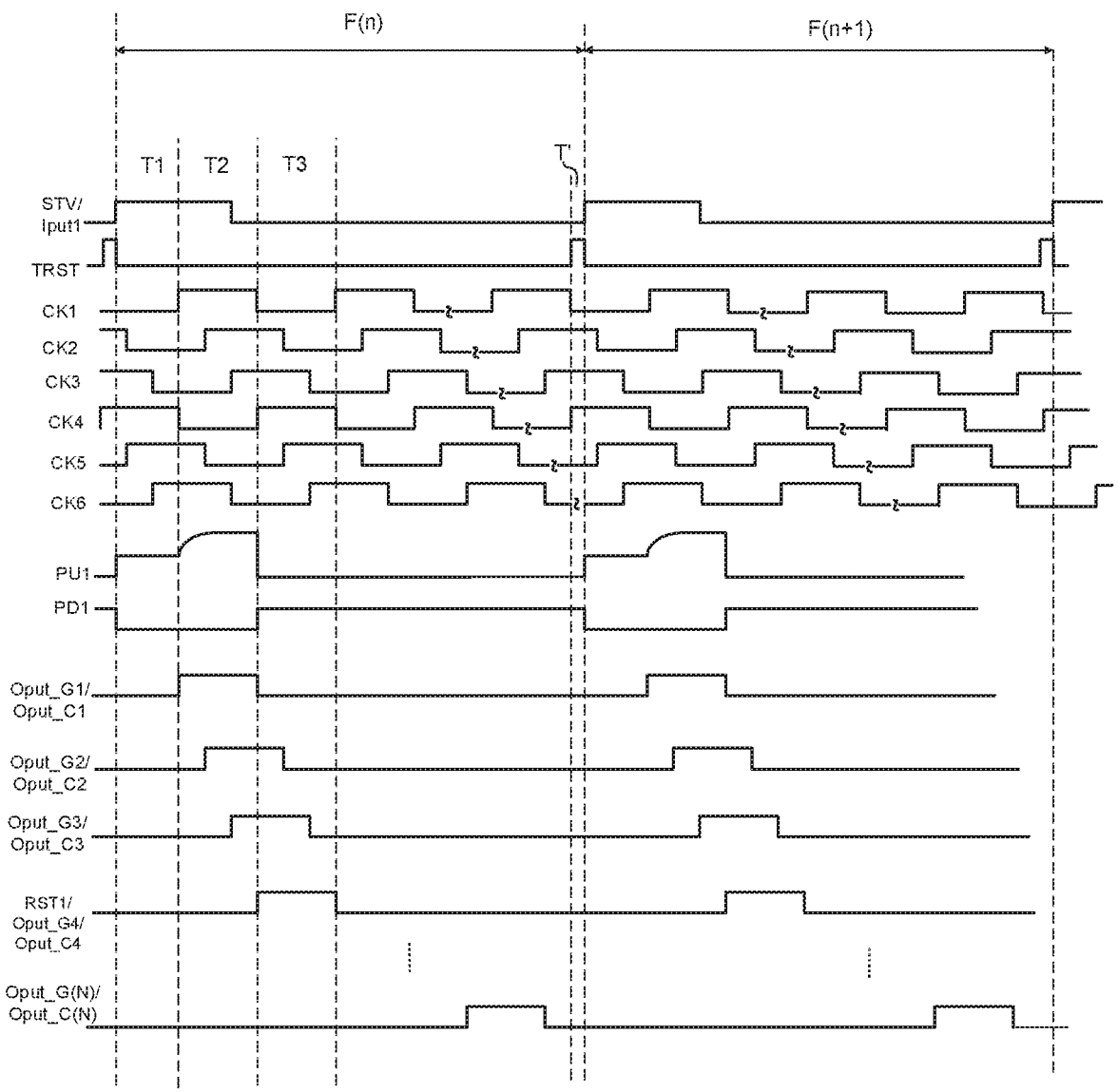
FIG. 9 is a diagram showing timings of control signals of a shift register, according to some embodiments.

For convenience of description, referring to FIG. 9, in the first-stage shift register RS1, a signal from the signal input terminal Iput1 is represented by Iput1 a signal of a pull-up node PU1 is represented by PU1, a signal of a pull-down node PD1 is represented by PD1, and a signal from a reset signal terminal RST1 is represented by RST1. A signal from a scan signal output terminal Oput_Gi of the i-th-stage shift register RSi is represented by Oput_Gi, and a signal from a cascade signal output terminal of the i-th-stage shift register RSi is represented by Oput_Ci. The signal output from the scan signal output terminal Oput_Gi of the i-th-stage shift register RSi is the same as the signal output from the cascade signal output terminal Oput_Ci of the i-th-stage shift register RSi. Therefore, the two signals are represented by a same waveform in FIG. 9 for a simple description, but it does not mean that the two signals are a same signal.

It will be seen in combination with FIG. 8 that, the signal input terminal Iput1 of the first-stage shift register RS1 is coupled to the start signal terminal STV, and the reset signal terminal RST1 of the first-stage shift register RS1 is coupled to a cascade signal output terminal Oput_C4 of a fourth-stage shift register RS4. A clock signal terminal CLK of the first-stage shift register RS1 is coupled to a first clock signal line CK1, and a clock signal terminal CLK of the fourth-stage shift register RS4 is coupled to a fourth clock signal line CK4.

The embodiments of the present disclosure further provide a method for driving a shift register RS. The driving method is applied to the shift register RS in any of the above embodiments.

In some embodiments, referring to FIG. 9, in the method for driving the shift register (taking the first-stage shift register RS1 as an example) of the present disclosure, a time of an image frame F (referring to an n-th image frame F(n) in FIG. 9) includes an input period T1, an output period T2 and a reset period T3.

In the input period T1:

referring to FIGS. 7, 8 and 9, an input sub-circuit 30 is turned on under control of a voltage from a start signal terminal STV (i.e., the signal input terminal Iput1), and transmits the voltage of the start signal terminal STV to the pull-up node PU1. An output sub-circuit 10 is turned on under control of a voltage of the pull-up node PU1, and transmits a voltage from a clock signal terminal CLK (i.e., the first clock signal line CK1) to a scan signal output terminal Oput_G1 and a cascade signal output terminal Oput_Cl. In addition, under control of the voltage of the pull-up node PU1, a voltage of a first voltage terminal VGL1 is transmitted to the pull-down node PD1 through first control sub-circuit 601.

For example, referring to FIGS. 7, 8 and 9, in the input period T1, the twelfth transistor M12 is turned on under control of a high-level voltage from the start signal terminal STV (i.e., the signal input terminal Iput1), and transmits the high-level voltage of the start signal terminal STV to the pull-up node PU1. The tenth transistor M10 and the fourth transistor M4 are turned on under control of the high-level voltage of the pull-up node PU1, and transmit a low-level voltage from the clock signal terminal CLK (i.e., the first clock signal line CK1) to the scan signal output terminal Oput_G1 and the cascade signal output terminal Oput_C1 And the first capacitor C1 is charged under control of the high-level voltage of the pull-up node PU1. In addition, the sixth transistor M6 is turned on under control of the high-level voltage of the pull-up node PU1, and transmits a low-level voltage received at the first voltage terminal VGL1 to the pull-down node P01.

It will be noted that, in the input period T1, although the eighth transistor M8 is in a normally-on state under control of a high-level voltage of a second voltage terminal VGH, in some embodiments, a channel width-to-length ratio of the seventh transistor M7 may be made greater than a channel width-to-length ratio of the eighth transistor M8, so as to ensure that the fifth transistor M5 is in a turn-off state in the input period T1, thereby ensuring that the low-level voltage of the first voltage terminal VGL1 is transmitted to the pull-down node PD1 through the turned-on sixth transistor M6 in the input period T1.

In the output period T2:

Referring to FIGS. 7, 8 and 9, the output sub-circuit 10 is turned on under control of the voltage of the pull-up node PU1, and transmits the voltage of the clock signal terminal CLK (i.e., the first clock signal line CK1) to signal output terminals Oput1 (i.e., the scan signal output terminal Oput_G1 and the cascade signal output terminal Oput_C1). Moreover, an compensation sub-circuit 20 is turned on under control of the voltage of the pull-up node PU1 and the voltage of the clock signal terminal CLK, and transmits a voltage of the signal output terminal Oput1 (e.g., the cascade signal output terminal Oput_Cl) to the pull-up node PU1, so as to compensate the voltage of the pull-up node PU1.

In addition, under control of the voltage of the pull-up node PU1, the voltage of the first voltage terminal VGL1 is transmitted to the pull-down node P01 through the first control sub-circuit 601.

For example, in some embodiments, referring to FIGS. 7, 8 and 9, in the output period T2, the first capacitor C1 releases electric charges stored in the input period T1 to the pull-up node PU1. The tenth transistor M10 and the fourth transistor M4 are turned on under control of the high-level voltage of the pull-up node PU1, and transmit the high-level voltage from the clock signal terminal CLK (i.e., the first clock signal line CK1) to the scan signal output terminal Oput_G1 and the cascade signal output terminal Oput_C1. That is, the scan signal output terminal Oput_G1 outputs a scan signal in the output period T2, and the cascade signal output terminal Oput_C1 outputs a cascade signal in the output period T2.

In addition, it will be understood that, the first capacitor C1 will further raise a potential at the pull-up node PU1 through its own coupling effect and bootstrap effect under an action of a high-level voltage (i.e., the scan signal) output from the scan signal output terminal Oput_G1

In addition, in the output period T2, the first transistor M1 and the second transistor M2 are turned on under control of the high-level voltage of the pull-up node PU1 and the high-level voltage of the clock signal terminal CLK, and transmit the high-level voltage received at the signal output terminal Oputl (e.g., the cascade signal output terminal Oput_C1) to the pull-up node PU1, so as to compensate the voltage of the pull-up node PU1. Moreover, the sixth transistor M6 is turned on under control of the high-level voltage of the pull-up node PU1, and transmits the low-level voltage of the first voltage terminal VGL1 to the pull-down node PD1.

In the reset period:

Referring to FIGS. 7, 8 and 9, a reset sub-circuit 40 is turned on under control of a voltage from the reset signal terminal RST1 (i.e., an output signal from the cascade signal output terminal Oput_C4 of the fourth-stage shift register RS4), and transmits the voltage received at the first voltage terminal VGL1 to the pull-up node PU1. Under control of the voltage of the pull-up node PU1 and the voltage received at the second voltage terminal VGH, the voltage of the second voltage terminal VGH is transmitted to the pull-down node PD1 through the first control sub-circuit 601. A second control sub-circuit 602 is turned on under control of a voltage of the pull-down node PD1, and transmits the voltage received at the first voltage terminal VGL1 to the pull-up node PU1. Moreover, a first pull-down sub-circuit 501 is turned on under control of the voltage of the pull-down node PD1, and transmits a voltage received at a third voltage terminal VGL2 to the scan signal output terminal Oput_G1, and a second pull-down sub-circuit 502 is turned on under control of the voltage of the pull-down node P01, and transmits the voltage received at the first voltage terminal VGL1 to the cascade signal output terminal Oput_C1.

For example, referring to FIGS. 7, 8 and 9, in the reset period T3, the thirteenth transistor M13 is turned on under control from a high-level voltage of the reset signal terminal RST1 (i.e., the output signal from the cascade signal output terminal Oput_C4 of the fourth-stage shift register RS4), and transmits the low-level voltage received at the first voltage terminal VGL1 to the pull-up node PU1. The sixth transistor M6 and the seventh transistor M7 are turned off, and the fifth transistor M5 and the eighth transistor M8 are turned on under control of the low-level voltage of the pull-up node PU1 and the high-level voltage received at the second voltage terminal VGH, the high-level voltage of the second voltage terminal VGH is transmitted to the pull-down node PD1. The eleventh transistor M11 is turned on under control of the high-level voltage of the pull-down node PD1, and transmits the low-level voltage of the first voltage terminal VGL1 to the pull-up node PU1. Moreover, the ninth transistor M9 is turned on under control of the high-level voltage of the pull-down node PD1, and transmits a low-level voltage received at the third voltage terminal VGL2 to the scan signal output terminal Oput_G1, and the tenth transistor M10 is turned on under control of the high-level voltage of the pull-down node PD1, and transmits the voltage received at the first voltage terminal VGL1 to the cascade signal output terminal Oput_C1.

On this basis, as for the gate driving circuit 01 (i.e., the stages of shift registers), as shown in FIG. 9, the time of an image frame F further includes an initialization period T' set before a start of a time of a next image frame F(n+1).

As shown in FIG. 9, in the initialization period T', the initialization sub-circuit 70 in the shift register in each stage is turned on under control from the voltage of the initialization signal terminal TRST, and transmits the voltage received at the first voltage terminal VGL1 to the pull-up node PU.

For example, referring to FIG. 9, in the initialization period T', the fourteenth transistor M14 in the shift register in each stage is turned on under control of a high-level voltage of the initialization signal terminal TRST, and transmits the low-level voltage received at the first voltage terminal VGL1 to the pull-up node PU, so as to initialize the pull-up node PU in the shift register in each stage, so that the pull-up node PU of the shift register in each stage in the gate driving circuit 01 is in an initialization state at a beginning of each image frame, thereby ensuring a stable output in the driving process, and further ensuring a stability of the displayed image.

In addition, a discharge period may also be set before the display device is turned off each time.

In the discharge period, the voltage received at the third voltage terminal VGL2 may be inverted. That is, a potential at the third voltage terminal VGL2 in the discharge period and a potential at the third voltage terminal VGL2 in a normal image frame F are opposite. For example, in the normal image frame F, the voltage received at the third voltage terminal VGL2 is a low-level voltage, and in the discharge period, the voltage of the third voltage terminal VGL2 may be adjusted to a high-level voltage.

In this case, in the discharge period, the first pull-down sub-circuit 501 of the shift register in each stage is turned on under control of the voltage of the pull-down node PD, and transmits the voltage received at the third voltage terminal VGL2 to the scan signal output terminal Oput_G, thereby turning on the transistors T in the pixel circuits S coupled to all the gate lines GL in the display panel 001, and releasing the residual charges in all the pixel circuits S in the display panel 001 to prevent the residual charges from adversely affecting the display panel 001.

Figure 10:
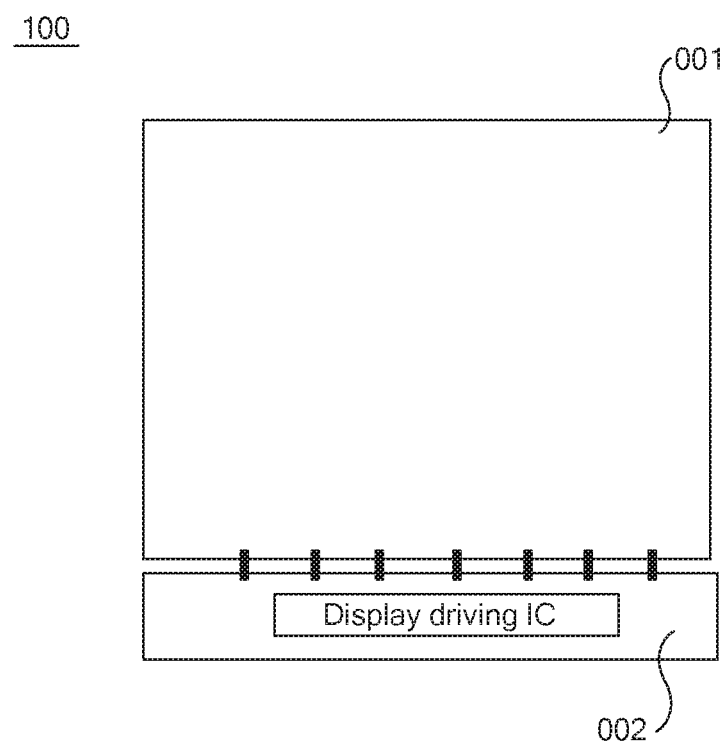
FIG. 10 is a diagram showing a structure of a display device, according to some embodiments.

The embodiments of the present disclosure further provide a display device 100. As shown in FIG. 10, the display device 100 includes the display panel 001 according to any of the above embodiments, a circuit board 002 and a display driving IC.

The display panel 001 includes the gate driving circuit 01.

In addition, the display device 100 further includes a frame and other electronic components. In this case, the display panel 001, the circuit board 002, the display driving IC, and the other electronic components are disposed in the frame.

For example, the display device 100 may be a television, a mobile phone, a computer, a notebook computer, a tablet computer, a personal digital assistant (PDA), or a vehicle-mounted computer.

The display panel 001 may be a liquid crystal display (LCD), an organic light-emitting diode (OLED) display panel, a quantum dot light-emitting diode (OLED) display panel, or a micro light-emitting diode (Micro LED) display panel, which is not specifically limited in the present disclosure.

The embodiments of the present disclosure are described by taking an example in which the display panel 001 is an LCD.

A person of ordinary skill in the art will understand that, all or part of the steps in the above method embodiments may be implemented by using hardware related to program instructions. The program instructions may be stored in a computer-readable storage medium for executing the steps included in the above method embodiments, The storage medium includes various media capable of storing program codes, such as a read-only memory (ROM), a random-access memory (RAM), a magnetic disk, or an optical disk.

The forgoing descriptions are merely specific implementation manners of the present disclosure, but the protection scope of the present disclosure is not limited thereto, Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A shift register, comprising:
   an output sub-circuit coupled to a pull-up node, a clock signal terminal and a signal output terminal, wherein the output sub-circuit is configured to transmit a voltage of the clock signal terminal to the signal output terminal under control of a voltage of the pull-up node; and
   a compensation sub-circuit coupled to the pull-up node, the clock signal terminal and the signal output terminal, wherein the compensation sub-circuit is configured to transmit a voltage of the signal output terminal to the pull-up node under control of the voltage of the pull-up node and the voltage of the clock signal terminal.

2. The shift register according to claim 1, wherein the compensation sub-circuit includes:
   a first compensation sub-circuit coupled to the pull-up node and the clock signal terminal; and
   a second compensation sub-circuit coupled to the pull-up node, the signal output terminal and the first compensation sub-circuit, wherein the first compensation sub-circuit is configured to transmit the voltage of the clock signal terminal to the second compensation sub-circuit under control of the voltage of the pull-up node, and the second compensation sub-circuit is configured to transmit the voltage of the signal output terminal to the pull-up node under control of the received voltage of the clock signal terminal.

3. The shift register according to claim 2, wherein the first compensation sub-circuit includes:

a first transistor, wherein a control electrode of the first transistor is coupled to the pull-up node, and a first electrode of the first transistor is coupled to the clock signal terminal; and the second compensation sub-circuit includes:

a second transistor, wherein a control electrode of the second transistor is coupled to a second electrode of the first transistor, a first electrode of the second transistor is coupled to the signal output terminal, and a second electrode of the second transistor is coupled to the pull-up node.

4. The shift register according to claim 1, wherein the output sub-circuit includes a scan output sub-circuit and a cascade output sub-circuit; wherein the scan output sub-circuit is configured to transmit the voltage of the clock signal terminal as a scan signal to a scan signal output terminal under control of the voltage of the pull-up node, and the cascade output sub-circuit is configured to transmit the voltage of the clock signal terminal as a cascade signal to a cascade signal output terminal under control of the voltage of the pull-up node; and the signal output terminal is one of the scan signal output terminal and the cascade signal output terminal.

5. The shift register according to claim 4, wherein the signal output terminal is the cascade signal output terminal.

6. The shift register according to claim 4, wherein the scan output sub-circuit includes:

a third transistor, wherein a control electrode of the third transistor is coupled to the pull-up node, a first electrode of the third transistor is coupled to the clock signal terminal, and a second electrode of the third transistor is coupled to the scan signal output terminal; and a first capacitor, wherein a first electrode of the first capacitor is coupled to the pull-up node, and a second electrode of the first capacitor is coupled to the scan signal output terminal; and the cascade output sub-circuit includes:

a fourth transistor, wherein a control electrode of the fourth transistor is coupled to the pull-up node, a first electrode of the fourth transistor is coupled to the clock signal terminal, and a second electrode of the fourth transistor is coupled to the cascade signal output terminal.

7. The shift register according to claim 4, further comprising:

a first pull-down sub-circuit coupled to the scan signal output terminal, a third voltage terminal and a pull-down node, wherein the first pull-down sub-circuit is configured to transmit a voltage received at the third voltage terminal to the scan signal output terminal under control of a voltage of the pull-down node; and a second pull-down sub-circuit coupled to the cascade signal output terminal, a first voltage terminal and the pull-down node, wherein the second pull-down sub-circuit is configured to transmit a voltage received at the first voltage terminal to the cascade signal output terminal under control of the voltage of the pull-down node.

8. The shift register according to claim 7, wherein the first pull-down sub-circuit includes:

a ninth transistor, wherein a control electrode of the ninth transistor is coupled to the pull-down node, a first electrode of the ninth transistor is coupled to the third voltage terminal, and a second electrode of the ninth transistor is coupled to the scan signal output terminal; and the second pull-down sub-circuit includes:

a tenth transistor, wherein a control electrode of the tenth transistor is coupled to the pull-down node, a first electrode of the tenth transistor is coupled to the first voltage terminal, and a second electrode of the tenth transistor is coupled to the cascade signal output terminal.

9. The shift register according to claim 1, further comprising: a first control sub-circuit coupled to a first voltage terminal, a second voltage terminal, the pull-up node and a pull-down node, wherein the first control sub-circuit is configured to transmit a voltage received at the first voltage terminal to the pull-down node under control of the voltage of the pull-up node, and to transmit a voltage received at the second voltage terminal to the pull-down node under control of the voltage of the pull-up node and the voltage received at the second voltage terminal.

10. The shift register according to claim 9, wherein the first control sub-circuit includes:

a fifth transistor, wherein a control electrode of the fifth transistor is coupled to a control node, a first electrode of the fifth transistor is coupled to the second voltage terminal, and a second electrode of the fifth transistor is coupled to the pull-down node;

a sixth transistor, wherein a control electrode of the sixth transistor is coupled to the pull-up node, a first electrode of the sixth transistor is coupled to the first voltage terminal, and a second electrode of the sixth transistor is coupled to the pull-down node;

a seventh transistor, wherein a control electrode of the seventh transistor is coupled to the pull-up node, a first electrode of the seventh transistor is coupled to the first voltage terminal, and a second electrode of the seventh transistor is coupled to the control node; and an eighth transistor, wherein a control electrode and a first electrode of the eighth transistor are coupled to the second voltage terminal, and a second electrode of the eighth transistor is coupled to the control node.

11. The shift register according to claim 1, further comprising: a second control sub-circuit coupled to a first voltage terminal, the pull-up node and a pull-down node, wherein the second control sub-circuit is configured to transmit a voltage received at the first voltage terminal to the pull-up node under control of a voltage of the pull-down node.

12. The shift register according to claim 11, wherein the second control sub-circuit includes:

an eleventh transistor, wherein a control electrode of the eleventh transistor is coupled to the pull-down node, a first electrode of the eleventh transistor is coupled to the first voltage terminal, and a second electrode of the eleventh transistor is coupled to the pull-up node.

13. The shift register according to claim 1, further comprising:

an input sub-circuit coupled to a signal input terminal and the pull-up node, wherein the input sub-circuit is configured to transmit a voltage of the signal input terminal to the pull-up node under control of the voltage of the first signal input terminal; and a reset sub-circuit coupled to a reset signal terminal, a first voltage terminal and the pull-up node, and the reset sub-circuit is configured to transmit a voltage received at the first voltage terminal to the pull-up node under control of a voltage of the reset signal terminal.

14. The shift register according to claim 13, wherein the input sub-circuit includes:

a twelfth transistor, wherein a control electrode and a first electrode of the twelfth transistor are coupled to the signal input terminal, and a second electrode of the twelfth transistor is coupled to the pull-up node; and the reset sub-circuit includes:

a thirteenth transistor, wherein a control electrode of the thirteenth transistor is coupled to the reset signal terminal, a first electrode of the thirteenth transistor is coupled to the first voltage terminal, and a second electrode of the thirteenth transistor is coupled to the pull-up node.

15. The shift register according to claim 1, further comprising: an initialization sub-circuit coupled to an initialization signal terminal, the pull-up node and a first voltage terminal, wherein the initialization sub-circuit is configured to transmit a voltage received at the first voltage terminal to the pull-up node under control of a voltage of the initialization signal terminal.

16. The shift register according to claim 15, wherein the initialization sub-circuit includes:

a fourteenth transistor, wherein a control electrode of the fourteenth transistor is coupled to the initialization signal terminal, a first electrode of the fourteenth transistor is coupled to the first voltage terminal, and a second electrode of the fourteenth transistor is coupled to the pull-up node.

17. A gate driving circuit, comprising a plurality of cascaded shift registers according to claim 1.

18. A display device, comprising the gate driving circuit according to claim 17.

19. A method for driving the shift register according to claim 1, comprising:

turning on the output sub-circuit under control of the voltage of the pull-up node, and transmitting, by the output sub-circuit, the voltage of the clock signal terminal to the signal output terminal; and turning on the compensation sub-circuit under control of the voltage of the pull-up node and the voltage of the clock signal terminal, and transmitting, by the compensation sub-circuit, the voltage of the signal output terminal to the pull-up node to compensate the voltage of the pull-up node.

* * * * *